(12) United States Patent
Mooradian (10) Patent No.: US 6,614,827 B1
(45) Date of Patent: Sep. 2, 2003

(54) HIGH POWER LASER (75) Inventor: Aram Mooradian, Winchester, MA (US)

(73) Assignee: Novalux, Inc., Sunnyvale, CA (US)

( * ) Notice: Subject to any disclaimer, the term of this patent is extended or adjusted under 35 U.S.C. 154(b) by 0 days.

(21) Appl. No.: 09/409,825

(22) Filed: Sep. 30, 1999

Related U.S. Application Data (63) Continuation-in-part of application No. PCT/US98/05472, filed on Mar. 19, 1998, which is a continuation-in-part of application No. 08/888,533, filed on Jul. 7, 1997, now Pat. No. 6,243,407.
(60) Provisional application No. 60/041,185, filed on Mar. 21, 1997.

(51) Int. Cl.$^7$ .................................................. H01S 3/08
(52) U.S. Cl. .......................................... 372/92; 372/82
(58) Field of Search ............................... 372/31, 96, 92

(56) References Cited

U.S. PATENT DOCUMENTS

| | | | | |
|---|---|---|---|---|
| 4,499,569 A | * | 2/1985 | Lopez De Romana | 369/45 |
| 4,714,824 A | * | 12/1987 | Terazono | 250/211 |
| 5,301,201 A | * | 4/1994 | Dutta | 372/43 |
| 5,426,657 A | * | 6/1995 | Vakhshoori | 372/45 |
| 5,905,750 A | * | 5/1999 | Lebby | 372/50 |
| 5,943,357 A | * | 8/1999 | Lebby | 372/50 |
| 6,246,708 B1 | * | 6/2001 | Thornton | 372/50 |
| 2002/0031155 A1 | * | 3/2002 | Tayebati | 372/50 |

* cited by examiner

*Primary Examiner*—Paul Ip
*Assistant Examiner*—Hung Vy

(74) *Attorney, Agent, or Firm*—Fulbright & Jaworski, LLP (57) ABSTRACT

In an apparatus and method for generating high power laser radiation, the geometry of the resonant laser cavity defines a fundamental spatial or transverse cavity mode. A gain medium is disposed within the resonant cavity and an energy source energizes the gain medium within a first volume. This causes spontaneous and stimulated energy emission to propagate in the gain medium in a direction transverse to the fundamental cavity mode. The transverse emission in turn optically pumps a second volume of the gain medium about the first volume. When the intensity of the transverse emission is sufficiently high, inversion and gain are produced in the second volume. By optimizing the geometry of the cavity such that the fundamental cavity mode is coupled to both the first and the second volumes encompassing the first pumped volume, the transversely-directed energy of the first volume which would otherwise be wasted is instead captured by the fundamental beam, improving the overall power efficiently of the laser. When configured in an appropriate cavity, the high-power laser of the present invention is especially amenable to frequency conversion of the output beam, as it provides beam intensities suitable for efficient nonlinear frequency conversion. The vertical external cavity laser may employ an optical element configured on one side as a resonator mirror and on the other side as a focusing device for coupling the laser beam to an optical fiber. The resonator mirror side is concave while the focusing side is convex with the optical element being disposed relative to the body of the laser so as to optimize power output and to provide optimal focusing of the beam into the aperture of the optical fiber. The optical element may have an electrode attached on each side with the electrodes measuring light output from the laser via an ohmmeter connected in series with the electrodes.

6 Claims, 8 Drawing Sheets

HIGH POWER LASER

RELATED APPLICATIONS

This application is a continuation-in-part of copending international application PCT/US98/05472, filed on Mar. 19, 1998, which is a continuation-in-part and claims the benefit of U.S. patent application Ser. No. 08/888,533, filed on Jul. 7, 1997 now U.S. Pat. No. 6,243,407, which claims the benefit of U.S. Provisional Patent Application Ser. No. 60/041,185, filed on Mar. 21, 1997, and the contents of all three applications are incorporated herein by reference. This application is also related to a copending application entitled "AN IMPROVED EFFICIENCY HIGH POWER LASER DEVICE" filed herewith on the same date, the content of which copending application is also incorporated herein by reference.

BACKGROUND OF THE INVENTION

Semiconductor lasers in common use today include edge-emitting diode lasers and vertical cavity surface emitting lasers (VCSELs). In an edge-emitting laser, a semiconductor gain medium, for example a quantum-well semiconductor structure, is formed on a surface of a semiconductor substrate. Cavity mirrors are formed or otherwise positioned on opposite sides of the substrate, perpendicular to the substrate surfaces, to form a resonant cavity which includes the gain medium. Electrical or optical pumping of the gain medium generates a laser beam which propagates in a direction along the plane of the substrate.

Edge-emitting lasers are among the most common semiconductor laser devices. Available commercially as individual units and in linear bar arrays, they are used, for example, as an optical pump source for pumping solid state lasers. High power, typically greater than a few hundred milliwatts, adaptations of edge-emitting lasers commonly operate in high order spatial modes and at multiple frequencies. This prevents their use in applications which require high power laser output in a single spatial mode and/or at a single frequency. Edge emitters also have a significant degree of astigmatism and a beam aspect ratio which is generally large, making it difficult to focus the beam to a small spot, which prevents their use in those applications which require a focused output beam. Poor beam quality in edge-emitting lasers also makes frequency doubling of the laser output using nonlinear optical materials difficult and inefficient.

In conventional VCSEL lasers, cavity mirrors are formed or otherwise positioned on opposite faces of a semiconductor gain medium grown on a semiconductor substrate. Electrical or optical pumping generates a laser beam emitted in a direction orthogonal to the plane of the substrate.

Conventional VCSELs find application in optical communications and optical interconnect systems. VCSEL lasers are characterized by generally low fundamental spatial mode $TEM_{00}$ output powers, limited to about 8–10 milliwatts (mW) continuous wave (cw), and are further characterized by small fundamental spatial mode beam diameters, on the order of several micrometers ($\mu$m). Larger area VCSEL emitters, with beam diameters on the order of 100 $\mu$m can produce output beams having a few hundred mW of cw output power. However, operation of conventional VCSELs at high power and large diameter generally carries with it the penalty of an output beam having high-order spatial modes and multiple frequencies. In an external cavity VCSEL configuration, referred to in the art as a vertical external cavity surface emitting laser (VECSEL), an external reflector serves as the output coupler. External cavity VECSEL devices can provide higher fundamental spatial mode output power than VCSEL devices.

Previous work on external cavity vertically emitting semiconductor lasers typically resulted in low output power. The work of Sandusky and Brueck, for example, produced low output power and used optical pumping to excite the semiconductor. See J. V. Sandusky and S. R. J. Brueck, "A cw external cavity surface-emitting laser", *Photonics Technology Letters*, vol. 8 pp. 313–315, 1996. In a study by Hadley et al., an electrically excited VCSEL in an external cavity produced 2.4 mW cw and 100 mW pulsed in a fundamental spatial mode. In this case, an emitting area up to 120 $\mu$m was used. See M. A. Hadley, G. C. Wilson, K. Y. Lau and J. S. Smith, "High single-traverse mode output from external cavity surface emitting laser diodes", *Applied Phys. Letters*, vol. 63, pp. 1607–1609, 1993.

For various laser applications, a beam generated by the laser is subjected to frequency conversion or frequency doubling. This is accomplished by introducing a nonlinear material, for example KTP, KTN, $KNbO_3$, and $LiNbO_3$ into the laser path. The frequency of a beam incident on the nonlinear material is converted to a second frequency. The nonlinear materials are referred to as "doubling crystals" where the property of the material is such that it serves to double the frequency of a beam traversing the crystal. Efficient frequency conversion by the material generally requires a high-intensity, single mode incident beam.

Frequency doubling of semiconductor lasers has been demonstrated in the past to varying degrees of success using a doubling crystal mounted external to an edge-emitting diode laser cavity. The output beams from edge-emitting diode lasers are usually highly divergent and have significant aspect ratios as well as some degree of astigmatism which degrades the optical field intensity and phase front from that which is ideally required for efficient frequency doubling. Experiments have been carried out in which the light from a diode laser is launched into an optical waveguide fabricated in a nonlinear material in order to maintain the optical field intensity over some relatively long path length. This technique is generally complicated and uses relatively low power diode lasers which have sufficient beam quality to launch the laser light into the external waveguide.

Various techniques in the past have attempted to harness beam power to enable efficient conversion. A first technique by Gunter, P. Gunter et al. "Nonlinear optical crystals for optical frequency doubling with laser diodes", Proc. of SPIE, vol. 236, pages 8–18, 1980, demonstrated low efficiency frequency doubling of diode laser radiation using potassium niobate $KNbO_3$ in a single-pass doubling configuration. In another technique, Koslovsky et al., Optics Letters 12, 1014,1987, employed a single spatial mode, edge-emitting diode laser and $KNBO_3$ in an external ring resonator to increase the circulating power to achieve frequency conversion. The Koslovsky configuration required frequency-locking of the single-frequency laser to the Fabry-Perot resonance of the ring cavity as well as matching the temperature of the nonlinear crystal to both frequencies. This required complicated crystal alignment and wavelength control circuitry to maintain frequency locking.

SUMMARY OF THE INVENTION

The present invention is directed to an apparatus and method for generating high power laser radiation in a single fundamental spatial mode, in a manner which overcomes the aforementioned limitations. The laser of the present invention, when configured in an external cavity, is especially amenable to frequency conversion of the output beam, as it provides beam power densities over suitable path lengths for efficient frequency conversion.

The apparatus comprises a resonant cavity defined between first and second partial reflectors. The geometry of the resonant cavity defines a fundamental spatial or transverse cavity mode. A gain medium is disposed within the resonant cavity, and an energy source energizes the gain medium within a first volume. This causes spontaneous and stimulated energy emission to propagate in the gain medium in a direction transverse to the fundamental cavity mode. The transverse emission, in turn, optically pumps a second volume of the gain medium about the first volume. When the intensity of the spontaneous emission is sufficiently high, inversion and gain are produced in the second volume. The energy within the first and second volumes is coupled into the fundamental cavity mode laser beam. By optimizing the geometry of the cavity such that the fundamental cavity mode is coupled to both the first and second volumes, the energy of the first volume transversely-directed into the second volume, which would otherwise be wasted is instead captured by the fundamental beam, improving the overall power efficiency of the laser. To effect this, in a preferred embodiment, the cavity mirrors are selected to match the fundamental cavity mode to the cross-sectional diameter of the second volume. In this manner, the laser energy in the fundamental spatial mode is efficiently extracted from both first and second volumes of the gain medium. Similar results apply where the output energy is in a higher order spatial mode. The first volume is substantially cylindrical and of cross sectional diameter $D_1$, and the second volume is substantially an annulus of outer cross-sectional diameter $D_2$ and inner cross-sectional diameter $D_1$, the first and second volumes being substantially cross-sectionally concentric. The gain medium is preferably formed of a semiconductor material in a vertical cavity configuration. Alternatively, the gain medium may be formed of a solid state material having an active ion which has absorption in the spectral region of the gain transition. Examples of such solid state materials include Er:glass, Yb:glass, and Yb:YAG. In the case of solid state materials, pump energy would be preferably generated by optical means, for example a diode laser.

A nonlinear crystal may be placed in the optical cavity or external to the laser to change the laser output frequency. Suitable materials for nonlinear conversion include KTP, KTN, $KNBO_3$, and $LiNbO_3$ and periodically-poled materials such as periodically-poled $LiNbO_3$.

A preferred embodiment of the present invention, described in detail below, is capable of generating intracavity circulating power levels in excess of 100 kW in a fundamental spatial mode for a 1 mm diameter beam. These levels are sufficient for producing harmonic conversion of the fundamental radiation in a nonlinear material. As an example, frequency doubling in a semiconductor configuration using GaInAs gain media provides a fundamental wavelength of 900 nm to 1100 nm and a frequency doubled output in the blue to green wavelengths.

The invention is also directed to a laser for coupling light to the aperture of an optical fiber, the laser comprising a first optical element having a reflective surface and a transmissive surface; a second optical element optically coupled to the first optical element, the reflective surface of the first optical element and the second optical element defining a vertical cavity resonator; a laser body coupled to the second optical element for generating a laser beam within the vertical cavity resonator; the transmissive surface of the first optical element focusing the laser beam into the aperture of the optical fiber.

In accordance with one aspect of the present invention, the reflective surface of the first optical element is concave with the concave surface serving as a first resonator mirror of the vertical cavity resonator. The transmissive surface of the first optical element is convex with the convex surface focusing the laser beam into the aperture of the optical fiber.

In accordance with another aspect of the present invention, the second optical element serves as a second resonator mirror with the second resonator mirror and the first resonator mirror defining the vertical cavity resonator. The first resonator mirror has a first radius of curvature and the convex surface of the first optical element has a second radius of curvature.

In accordance with yet another aspect of the present invention, the vertical cavity resonator has a cavity length with the cavity length defined between the first resonator mirror and the second resonator mirror. The cavity length is substantially proximate in value to the first radius of curvature with the proximity in value optimizing light output from the laser. The second radius of curvature is a function of the first radius of curvature and the cavity length.

The invention is further directed to an optical coupler comprising a laser and an optical fiber coupled to the laser, the laser comprising a first optical element having a reflective surface and a transmissive surface, a second optical element optically coupled to the first optical element, the reflective surface of the first optical element and the second optical element defining a vertical cavity resonator, and a laser body coupled to the second optical element for generating a laser beam from the vertical cavity resonator; the optical fiber having an aperture for receiving the laser beam from the vertical cavity resonator, the transmissive surface of the first optical element focusing the laser beam into the aperture of the optical fiber.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
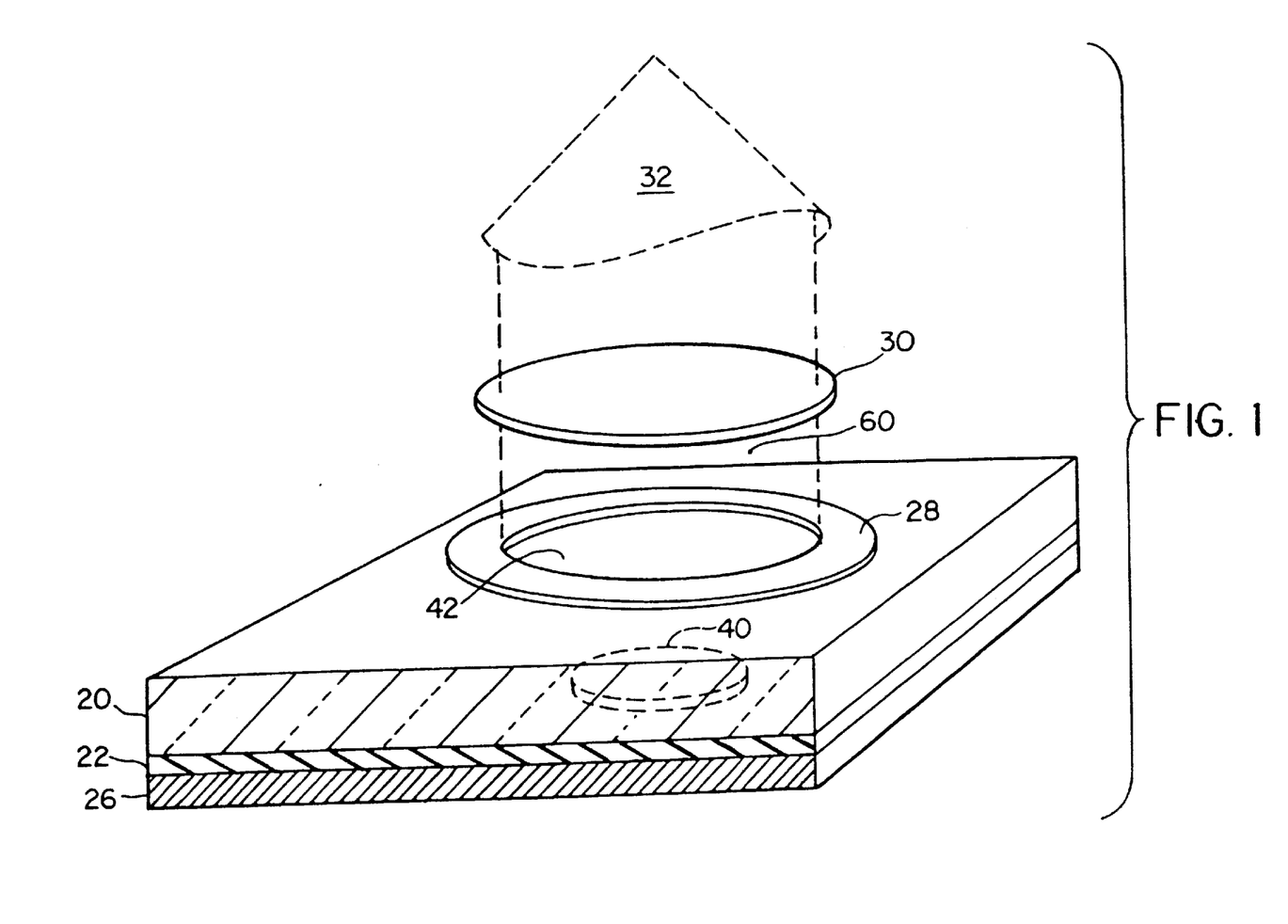
FIG. 1 is a perspective view of a VECSEL laser configuration in accordance with the present invention.

FIG. 1 is a perspective view of a preferred embodiment of the present invention, in a VECSEL configuration. The laser of FIG. 1 includes a semiconductor substrate 20, upon a first face of which is formed a semiconductor quantum-well gain region 22. A first reflector 26, for example a p-Bragg reflector, is formed on the quantum-well region 22. A second external reflector 30 is positioned opposite the first reflector 26. The distance between the first and second reflectors 26, 30 and their respective curvatures define a fundamental cavity mode 60. The second reflector 30 is illustrated as an external cavity mirror in FIG. 1 in accordance with a VECSEL configuration; however, the second reflector 30 may alternatively be layered directly adjacent the second face of the substrate to provide a VCSEL configuration. Note that for purposes of the present invention, the term "reflector" as used herein includes partially and/or fully reflective materials and/or surfaces. The surface 42 of the substrate 20 facing the second reflector 30 preferably is treated with an anti-reflection coating 42, such that any beam energy 60 traversing that interface will pass with minimal reflection, a desirable feature as is well known in the prior art.

Figure 2:
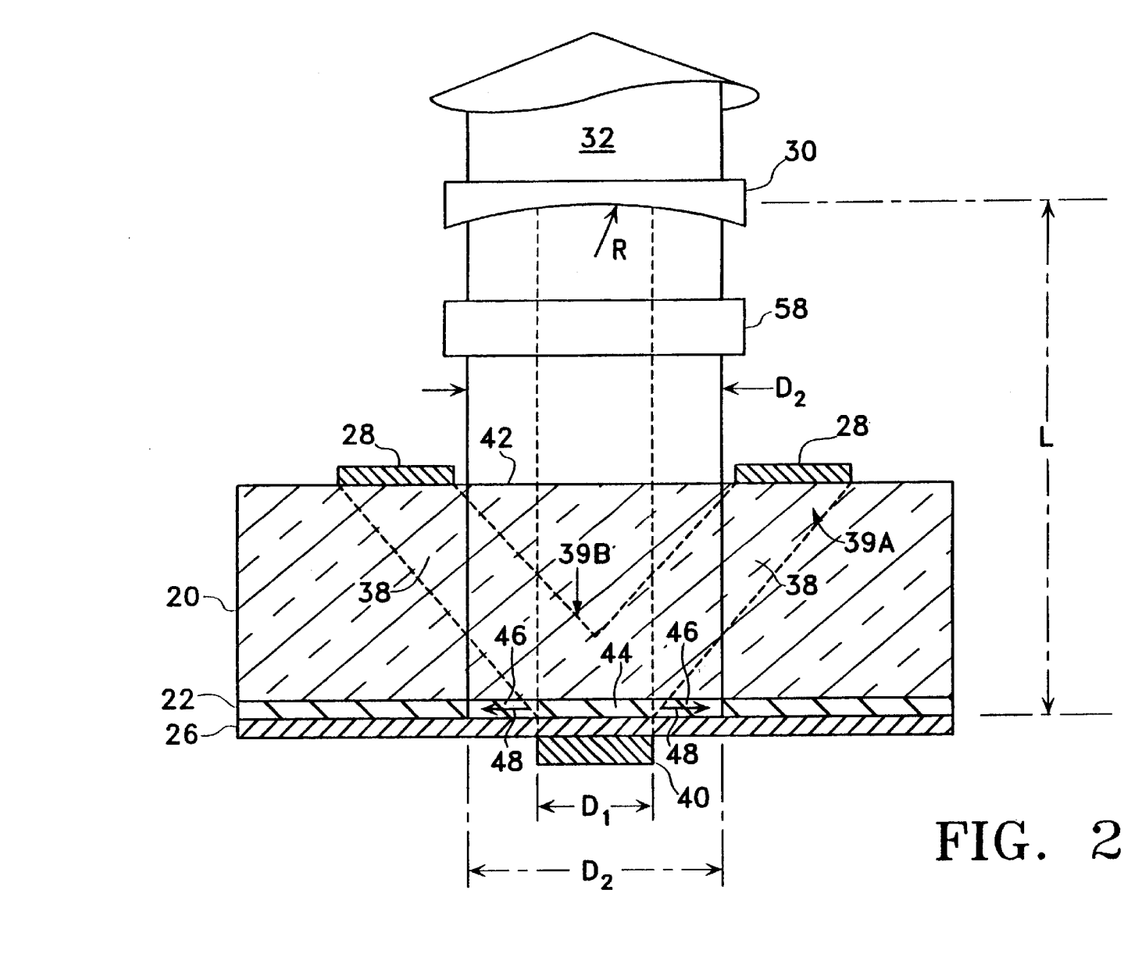
FIG. 2 is a cutaway side view of the configuration of FIG. 1 illustrating transverse propagation of spontaneous and stimulated emission from the first pumped volume into the second annular volume in accordance with the present invention.

As shown in the cross-sectional illustration of FIG. 2, the resonant cavity is pumped electrically through an annular electrical contact 28, causing current 38 to flow between annular contact 28 and circular contact 40 on opposite faces of the substrate 20. The resulting current flow 38 is generally conical in shape, the base 39A of the cone being at the annular contact 28 and the peak of the cone 39B being near contact 40. The flow in the peak 39B is generally circular in cross section and energizes a first substantially cylindrical volume 44 of the gain region 22, the first volume 44 being of a cross-sectional diameter $D_1$. The diameter $D_1$ is preferably substantially greater than the thickness of the gain region 22.

The excited gain region 22 of diameter $D_1$ generates stimulated and spontaneous emission, represented by arrows 48, which travels in a direction transverse to the propagation of the cavity laser beam. In standard prior-art VCSEL or VECSEL lasers, such energy would escape out the sides of the device or would otherwise be wasted as energy not contributing to the output beam 32. In the configuration of the present invention, this transverse energy 48 is absorbed in a second annular volume 46 surrounding the first pumped volume. This absorbed energy serves to pump the second volume 46, providing gain and therefore power into the fundamental laser mode 60.

When the electrical or optical pumping of the first region $D_1$ produces gain, this gain occurs for both the transverse and longitudinal directions. Since the transverse gain length is larger than the longitudinal gain length, more stimulated emission can occur in that direction. The larger the dimension $D_1$, the greater the net gain for stimulated emission in the transverse direction. Higher output power requires larger area devices because of thermal dissipation and the limit set by catastrophic degradation by the optical power density on the surface of the semiconductor in the longitudinal direction. For such large area devices, significant power can be lost by the occurrence of the transverse stimulated emission thereby reducing the overall power conversion efficiency. Spontaneous emission also occurs but becomes less important for the larger area devices. If the adjacent region is designed to absorb the stimulated emission (and also to a lesser extent the spontaneous emission), then the energy that otherwise would have been lost can be used to optically pump the second region $D_2$ to the extent that it will produce gain. The energy pumped into the second region $D_2$ can be extracted in the orthogonal direction by adjusting the external mirror 30 to produce a mode waist equal to $D_2$ on the gain medium. The external cavity mirror 30 will fix or "lamp" the gain in the total area defined by $D_1$ and $D_2$. There is a limit to the extent of the second region $D_2$, as the degree of transverse pumping decreases with decreasing intensity away from the center of the pumped region. This limit is related to the dimension $D_1$ and the pumping intensity (electrical or optical) in the area defined by $D_1$.

Given the mode waist diameter $D_2$, the technique for designing a cavity which would provide a suitable radius of curvature R for the second reflector 30 and the suitable optical cavity length L is well known in the art. See, for example, Herwig Kogelnik and Tingye Lee, "Beams, Modes, and Resonators", CRC Handbook of Lasers, CRC Press, 1971, pg. 421–441. The second diameter $D_2$ is a function of the excitation level and the diameter $D_1$. The design would be optimized for maximum output power limited by the circulating power density, which is limited by catastrophic degradation of the semiconductor, and the thermal power dissipation from the second diameter $D_2$. The mode waist diameter for the cavity could be matched, for example, by adjusting the cavity length L for a fixed radius of curvature R for the second reflector 30.

Figure 3:
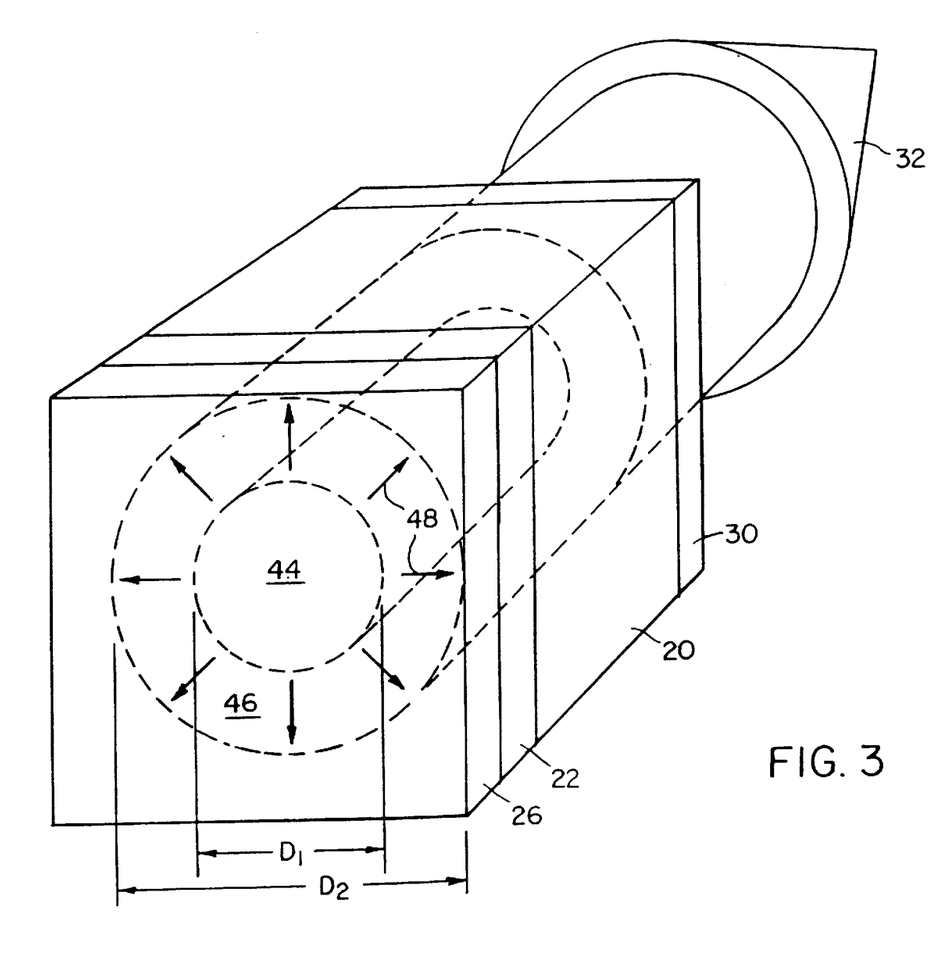
FIG. 3 is a perspective view of a VCSEL laser configuration illustrating the relationship of the first pumped volume and the second annular volume in accordance with the present invention.

FIG. 3 is a perspective view of a laser in a VCSEL configuration in accordance with the present invention illustrating the relationship of the first pumped volume 44 and the second output volume 46. The pumped first volume 44 is of diameter $D_1$ in the region of the gain medium 22. The transverse propagation of spontaneous and stimulated emission represented by arrows 48 optically pumps or otherwise energizes an annular volume 46 characterizing a second volume 46 surrounding the first volume 44. The annular volume 46 has an inner diameter of $D_1$ and an outer diameter of $D_2$ and is substantially cross-sectionally concentric with the first volume 44 assuming a Gaussian beam distribution. The fundamental cavity mode is optimized to have a diameter approximately equal to the outer diameter $D_2$ of the second volume 46, such that energy in both first and second volumes is captured and therefore contributes to the output beam 32. Excitation of the first volume 44, may occur by electrical or optical means.

The laser cavity parameters are preferably adjusted to set the mode waist diameter substantially equal to the diameter $D_2$ at the maximum operating power levels. In a laser cavity comprising a single flat mirror 26 and a single concave spherical mirror 30 having a radius of curvature R as shown in FIG. 2, the mode beam diameter on the laser chip $w_1$ and at the output mirror $w_2$ is characterized by:

$$W_1^2 = 4\lambda L/\pi[(R-L)/L]^{1/2} \tag{1}$$

$$W_2^2 = 4\lambda R/\pi[(L/(R-L)]^{1/2} \tag{2}$$

where L is the cavity length and $\lambda$ is the wavelength of the output laser beam 32 as described in Kogelnik et al. cited above. It is clear from these equations that the diameter of the fundamental laser mode can be made equal to the outer diameter $D_2$ of the second volume 46, for example by adjusting the cavity length L for a specific radius of curvature R. Alternatively, the radius of curvature R may be selected for a specific range of cavity lengths L. Instead of curved mirrors, a flat output coupler 30 may be employed with a lens in the cavity, of appropriate geometry to achieve the same results. A physical lens or thermal lens may be used for this purpose.

A preferred embodiment of a semiconductor laser device may comprise a multiple-element quantum-well structure or a single gain region having a total gain thickness equivalent to that of a multiple-quantum well-structure. In order to achieve a sufficient gain necessary to overcome the optical loss in the laser structure within the cavity, at least several quantum wells would be required to a laser device. For more efficient operation, at least ten quantum wells are used in order to effectively overcome the optical losses due to optical absorption at the laser wavelength in the conductive substrate layer 20. A typical thickness for a single quantum well is approximately 8–10 nm. Typically, a laser structure such as a GaInAs gain region 22 having more than 3 quantum wells requires strain compensation in the gain region 22, which may be accomplished by adding GaAsP layers to the gain region 22, as is well known in the art. The total thickness or the number of quantum wells can be increased to increase the gain to overcome all intracavity losses for efficient operation. This is limited only by the ability to uniformly grow such structures and by the practical threshold current density for such structures. Conventional VCSELs typically operate with only one or a few quantum wells between very high reflectivity mirrors. Such devices exhibit low optical gain and therefore would not operate as efficiently as the apparatus of the present invention.

The electrical current or optical pump energy injected into the laser device can be provided by any of the well-known methods, for example in G. P. Agarwal, "Semiconductor Lasers", The American Institute of Physics Press, pages 146–157. In a preferred embodiment of the present invention, most of the injection current 38 is directed into a circular region of a diameter equal to or less than the diameter $D_1$ of the fundamental spatial mode as defined by equations (1) and (2) above.

As described above, low efficiency frequency doubling of diode laser radiation using edge-emitting diode lasers has been demonstrated in the past by Gunter and Koslovsky et al. In contrast, the preferred embodiment of the present invention employs a VCSEL or VECSEL vertical cavity laser structure in which the total single pass gain is significantly lower than in edge-emitting lasers. In addition, the output from the vertical cavity device of the present invention is distributed over a much larger circular beam area than in edge-emitting devices, for example several hundred times greater in area. The achievable intracavity circulating power density in a fundamental circular spatial mode can exceed several MW/cm$^2$, limited only by catastrophic degradation at the semiconductor surface. While similar power densities can be achieved in edge-emitting lasers, the beam is confined to the waveguide of the diode cavity which makes frequency doubling difficult. Since the efficiency of frequency conversion is dependent on both the optical intensity and the length of the interaction region, frequency doubling of diode lasers is complicated and has been carried out in waveguide structures to maintain the field intensity of a sufficient interaction distance. A high conversion efficiency can be achieved in the present invention since high optical field intensities can be maintained over a sufficiently long interaction length because the beam is substantially non-divergent within the optical laser cavity. A high quality beam provides a more favorable frequency conversion situation for any conversion configuration outside of the cavity such as in the recently-studied periodically-poled nonlinear materials. Furthermore, the present invention can be operated in a pulsed, gain-switched, or mode-locked configuration to increase the optical power and therefore the nonlinear conversion efficiency. The present invention applies not only to harmonic frequency conversion, but also to sum and difference frequency generation. In a preferred embodiment, the nonlinear material includes Fabry-Perot resonances such that the laser operates in a single frequency. An exemplary configuration is illustrated in FIG. 2, which includes an intracavity nonlinear crystal 58 between the substrate 20 and external mirror 30.

Each prior art configuration mentioned above, for example the Sandusky et al. and Hadley et al. configuration, was limited by matching the cavity geometry to the extent of the pumped volume only, unlike the present invention which extracts energy from the first pumped volume in addition to the second volume energized by transverse energy emission generated in the first volume.

The output power in the present invention can be magnified by increasing the diameter of the mode volume, as described above. Peak output power levels, for example in excess of 10 kW, can be generated from a gain area of one millimeter in diameter. Continuous cw output power levels may exceed 10 Watts from a single element device, limited only by thermal considerations.

A second harmonic radiation which propagates in the backward direction can additionally be absorbed in a semiconductor laser structure in such a way as to produce electrons and holes which migrate to the active gain region, thereby increasing the power of the fundamental laser radiation. This also has the effect of increasing efficiency of the second harmonic output as well as producing a single-ended output of harmonic radiation. However, the materials between the frequency doubling materials, such as a non-linear crystal, and the gain region 22 must be transparent to the second harmonic radiation. In an alternative embodiment, a three-mirror cavity could be used in which the nonlinear material is disposed in a position in which the harmonic radiation does not reflect back into the gain medium but exits through the middle mirror. A ring resonator configuration may also be employed.

Typical frequency doubling materials appropriate for conversion of infrared wavelengths into the visible include periodically-poled $LiNbO_3$, KTP, and $KNbO_3$. For example KTP can be phase matched to convert 1 $\mu$m radiation into green wavelengths and $KNbO_3$ can convert infrared radiation into blue wavelengths using GaInAs diode lasers operating in the 900 nm wavelength range.

Many configurations for intracavity frequency doubling that are well known in the field can be used in the present invention. For example, a focusing lens can be positioned within the laser resonator defined by the mirrors 24 and 30 to increase the power density. The technique would allow use of very short lengths of nonlinear materials or nonlinear materials with lower nonlinear figures-of-merit.

For doubling materials such as KTP and $KNbO_3$, active crystal lengths can be significantly less than 1 cm for the circulating power levels possible in the present configurations. Shorter nonlinear material lengths provide wider temperature and wavelength phase matching conditions. For $KNbO_3$ for example, a crystal length of 1 mm or less can provide a temperature phase matching bandwidth of more than several degrees Celsius and a wavelength bandwidth of several nanometers. Such broad acceptance ranges make the manufacture and operation of such devices significantly more practical. The wavelength may be controlled by the selection of the alloy composition of the gain medium material, while precision wavelength control is achievable with intracavity etalons or other wavelength controlling techniques well known in the art. Similar results apply to other nonlinear materials, including KTP.

The semiconductor gain region 22 preferably comprises a multiple-element quantum well structure. Alternatively, a single gain region whose total gain thickness is equal to that of the multiple quantum well structure may be employed. As mentioned, in order to achieve sufficient gain, there has to be several quantum wells in the laser structure made from GaInAs. In order to achieve sufficient single pass gain, the number of quantum wells typical for a 900 nm to 1100 nm wavelength laser structure made from GaInAs should be more than 5 with a typical range of between 10 and 25 wells. For a high-peak-power device operating under pulsed conditions using either electrical or optical excitation, the number of wells could be more than 50. The limit is governed by the practical ability to grow large numbers of strain-free quantum well layers and strain compensating layers of GaAsP. In this case, a heterostructure may be a more effective choice. High-peak-power devices could be made, for example, by using high-power Q-switched solid state lasers as pump sources.

Conventional vertical cavity semiconductor lasers typically operate with only one or a few quantum wells and very-high-reflectivity cavity mirrors. Such devices may not operate as efficiently in the present invention because of inherently low optical gain. The net gain must be sufficient to overcome losses in the external cavity including the optical absorption losses in the substrate material 20 and the optical losses in the nonlinear material and associated anti-reflection coating on the intracavity optical elements.

FIG. 2 illustrates a typical quantum-well device 22 formed on a semiconductor substrate 20. A highly reflective mirror 26 is grown on the back surface of the device to provide one of the mirrors of the laser resonator. The top cladding layer serves as a conductive contact which can be antireflection coated 42 and which has low optical absorption at the laser wavelength. In an alternative embodiment, a layer of electrically-conductive material with an optical bandgap greater than the second harmonic radiation serves as the conductive layer with a second layer, of thickness less than the diffusion length of carriers, transparent to the fundamental laser radiation and absorbing the second harmonic radiation grown between the active material and the thick wide-bandgap material, would allow the optically excited carriers to diffuse into the gain region. The thick conductive material may comprise for example, deposited tin oxide.

Single frequency operation may be achieved, for example, by introducing an etalon in the cavity. Alternatively, the nonlinear crystal 58 may also serve as a frequency selective element.

The ability to generate visible wavelengths in high-power output makes the present invention attractive to a range of applications including projection display, optical disc read and write, optical holographic memory storage, and bio-fluorescence sensors. For the case of projection display, three primary colors could be generated. For example, the blue wavelength and green wavelength could be produced by frequency doubling the output of GaInAs semiconductor lasers whose outputs could be selected in the wavelength range from 900 nm to more than 1100 nm. Appropriate frequency doubling materials include KTP for the green wavelength and $KNbO_3$ for the blue wavelength. Power may be scaled using arrays of such devices. Output power levels of several tens of Watts may be generated. Since the output from such an array would lack coherence between elements of the array, the effects of speckle would be significantly reduced so as not to affect the quality of the projected image in the display system. In the case of an array device, the output couplers may comprise an array of lithographically-produced binary optical mirrors or micromirrors whose positions are precisely aligned with the center of the diode laser emitting areas.

A projection display system employing the present invention could be operated using various light valve devices such as liquid crystal spatial light modulators, micromirrors such as those sold by Texas Instruments, and grating deflector light valves such as those developed by Silicon Light Machines of Sunnyvale, Calif. For an array of laser sources, all elements of the light valve could be illuminated by every laser source by allowing the individual laser beams to expand so they overlap in the far field. In this way, the failure of one element would not significantly degrade the operation of the system. Binary optical lenses may be used to focus the laser light in a top-hat distribution onto each pixel of the light valve to make efficient use of all available laser radiation.

Figure 4:
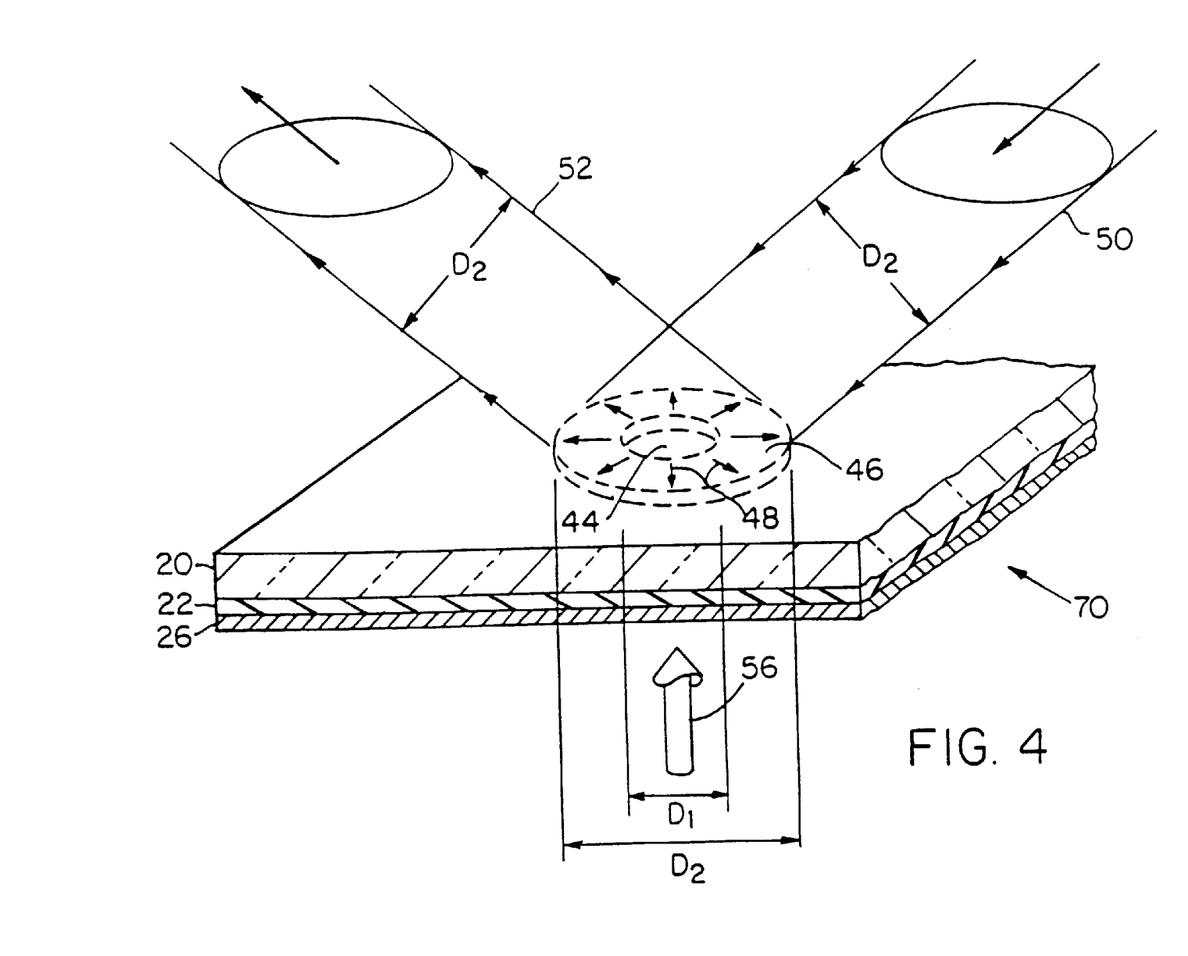
FIG. 4 is a perspective illustration of an optical amplifier configuration in accordance with the present invention.

As an example of an alternative embodiment, FIG. 4 is a perspective illustration of the present invention configured as an optical amplifier 70. As in the laser configuration, the optical amplifier 70 configuration includes a semiconductor substrate 20, a semiconductor gain medium 22, and a first reflector 26. Note that a second reflector is not required as the optical amplifier 70 does not include a resonant cavity. A first volume 44 of the gain medium 22 is pumped with electrical or optical energy 56. The first volume 44 is generally cross-sectionally circular, having a diameter $D_1$. As described above, this causes transverse stimulated and spontaneous propagation of energy 48 into a second volume 46 about the first volume 44. In a preferred embodiment, the second volume 46 is substantially circular in cross-section, the diameter being $D_2$. An incident beam 50 of diameter $D_2$ and of a first amplitude is directed at the pumped region 46, overlapping with and being energized by both the first volume 44 and second volume 46. The incident beam 50 reflects at mirror 26 and is released as an output beam 52 of similar diameter $D_2$. The output beam 52 is amplified by the energized gain region 46 and is therefore of higher intensity than the incident beam 50. A plurality of such gain elements may be used to increase the total gain of the system.

Figure 5A:
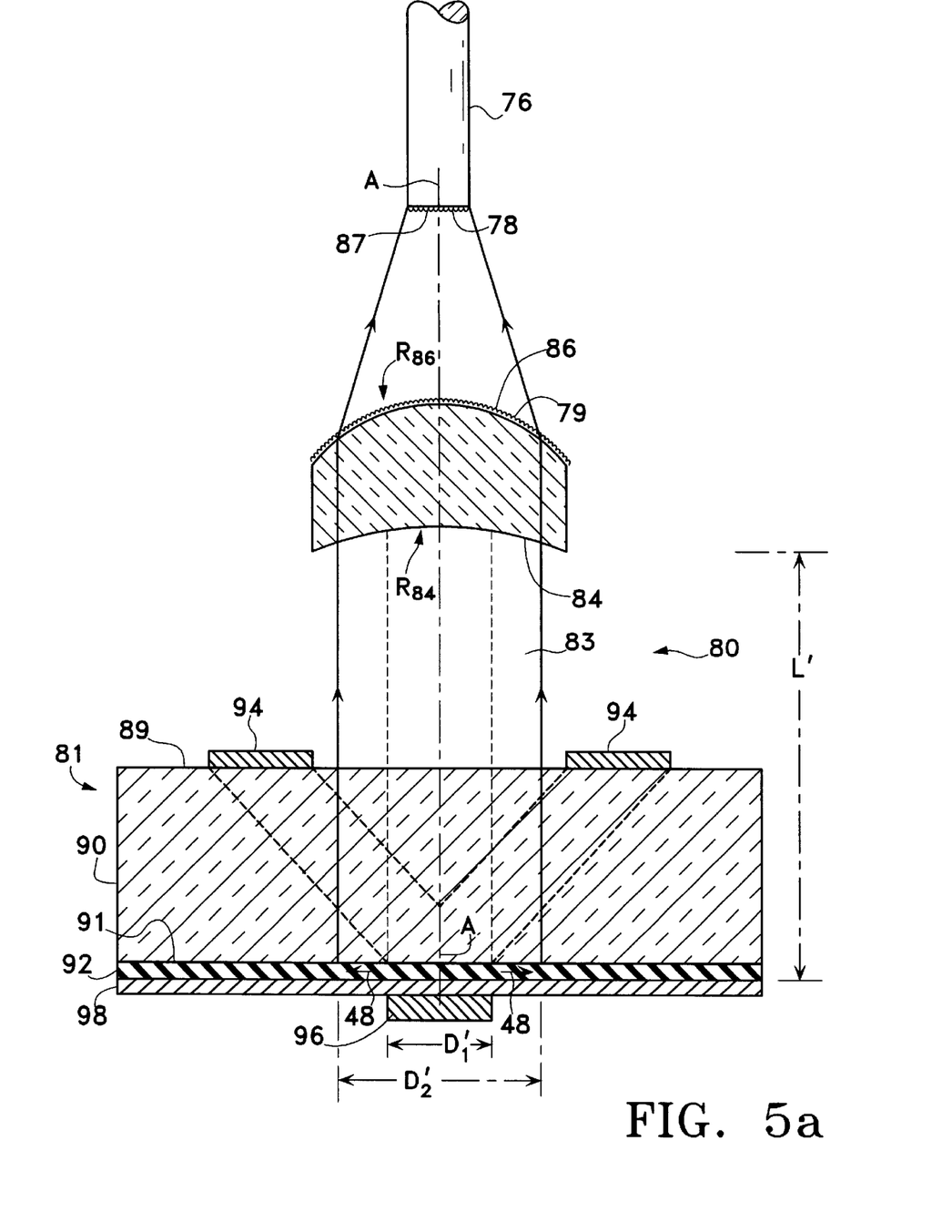
FIG. 5a is a side view of an alternative VECSEL configuration for coupling with an optical fiber in accordance with the present invention.

In accordance with another alternative embodiment of the present invention, FIG. 5a illustrates in cross section a vertical external cavity surface emitting laser (VECSEL) 80 in combination with an optical fiber 76 with the combination intended for manufacture as one unit for use in fiber-optic communication, optical amplifiers, printing and the like.

VECSEL 80 comprises a laser body 81 for producing a high energy output beam 83 via an optical element 82. Optical element 82 is preferably solid, radially symmetrical and designed to provide a dual function by having an inner concave surface 84 serving as the output reflector mirror for VECSEL 80 and an outer convex surface 86 serving as a lens to focus transmitted beam 83 into aperture 78 of optical fiber 76. Optical element 82 is preferably concentric with longitudinal axis A of VECSEL 80 and could be made of glass or a semiconductor material which is transparent to laser light.

Other materials may be used to manufacture optical element 82 as long as such materials are transparent to laser light and do not deviate from the intended purpose of the present invention.

Laser body 81 is preferably disposed under optical element 82 and has axis A as its center line. Laser body 81 includes a semiconductor substrate 90 having a bottom side 91 attached to a semiconductor quantum-well gain region 92 and a top side 89. A flat Bragg mirror 98 is formed on the underside of gain region 92. Laser body 81 is thus disposed for laser beam generation between optical element 82 and Bragg mirror 98 with the inner concave surface 84 of optical element 82 and Bragg mirror 98 serving as first and second resonator mirrors respectively. Mirror 98 is preferably centered on axis A with mirror 98 and concave surface 84 of optical element 82 defining a semi-confocal resonator cavity having a cavity length L'. The cavity length may range from a few millimeters to 1–2 cm depending on application.

Laser body 81 is electrically pumped via a pair of oppositely spaced electrodes 96, 94. Electrode 94 is preferably annular and mounted on top side 89 of semiconductor substrate 90. Electrode 96 is preferably circular and attached to the underside of resonator mirror 98. It will be appreciated by a person skilled in the art that laser body 81 may also be pumped optically in which case electrodes 94, 96 will be omitted.

As described above with reference to FIGS. 1–3, the conical current flow between electrodes 94, 96 energizes a cylindrical gain volume of diameter $D'_1$ which in turn stimulates radial emission outwardly to form another gain volume of diameter $D'_2$ which is annular in cross section and concentric with the original gain volume. Both gain volumes are preferably concentric with longitudinal axis A of VECSEL 80. The resultant energy beam has a mode waist diameter $d_1$ at the semiconductor level defined by: $d_1^2 = (4\lambda L'/\pi)\,[(R_{84}-L')/L']^{0.5}$, where $R_{84}$ is the radius of curvature of concave surface 84 of optical element 82, and a mode waist diameter $d_2$ at the optical element (concave surface 84 of optical element 82) which is respectively defined by: $d_2^2 = (4\lambda R_{84}/\pi)\,[L'/(R_{84}-L')]^{0.5}$. The optimal mode waist diameter at the output mirror of VECSEL 80 for a fundamental single spatial mode can be derived from the above equations by a person skilled in the art. To optimize the power output from the laser (as is well known in the art), the value of $R_{84}$ is chosen within 5% of the cavity length L'. Surface 84 is conventionally highly reflective to optimize power output from VECSEL 80. Convex surface 86 and aperture 78 of optical fiber 76 are preferably coated with a conventional dielectric anti-reflection coating 79 and 87, respectively, which is available commercially. During assembly of the inventive VECSEL/optical fiber combination, optical element 82 is aligned and positioned using conventional methods to ensure optimal focusing (via convex surface 86) of the laser beam into aperture 78 of optical fiber 76. Optical fiber 76 is mounted using well-known techniques such as soldering, epoxying and/or laser welding.

Figure 5B:
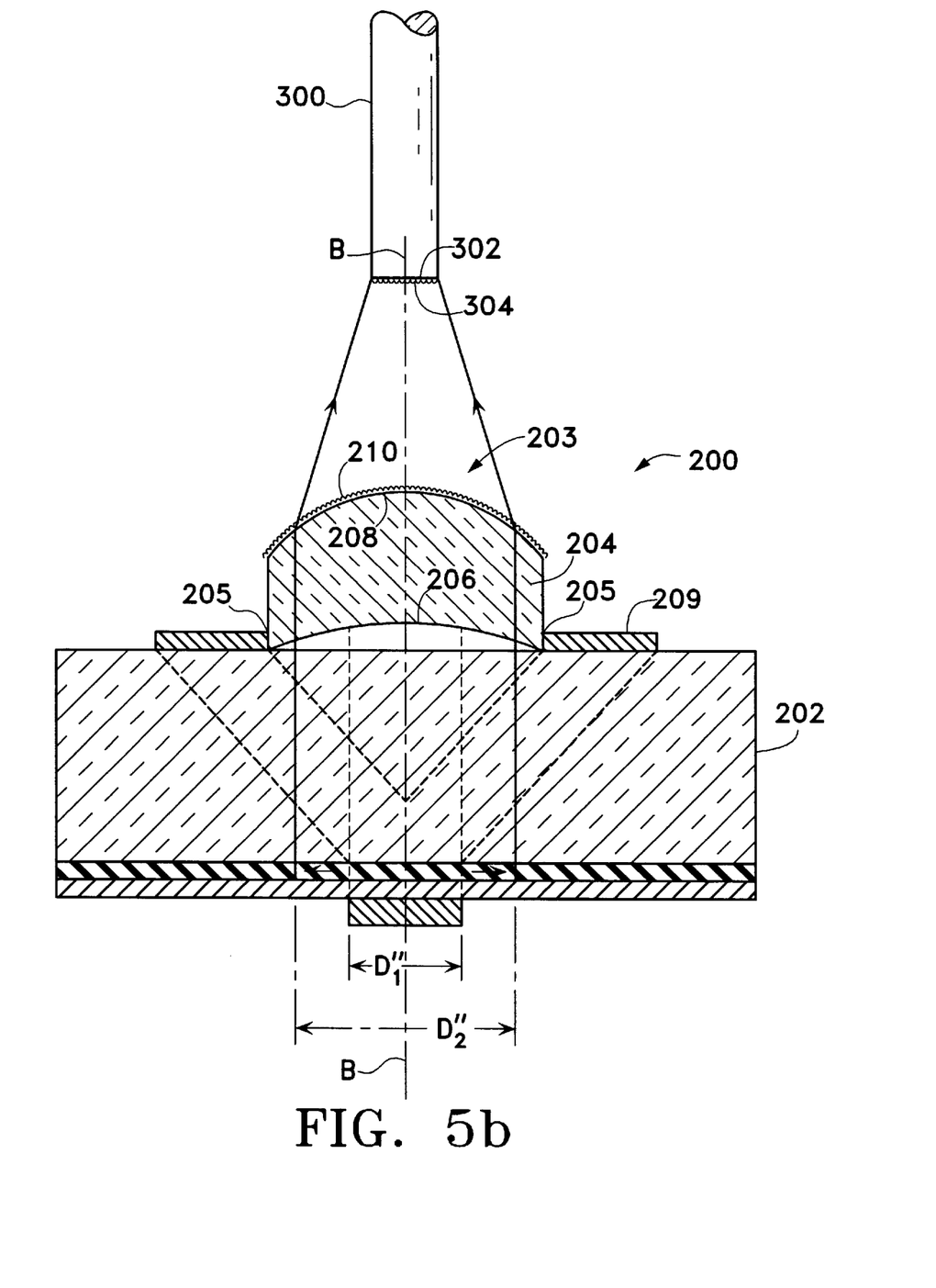
FIG. 5b is a side view of an alternative VCSEL configuration for coupling with an optical fiber in accordance with the present invention.

FIG. 5b shows another alternative embodiment of the present invention which is in fact a modified version of the laser/optical fiber combination of FIG. 5a. Specifically, a vertical cavity surface emitting laser (VCSEL) 200 in combination with an optical fiber 300 is disclosed with the combination also intended for manufacture as one unit for use in fiber-optic communication, optical amplifiers, printing and the like. With the exception of the optical fiber configuration, the rest of the setup is identical to the set up of FIG. 5a.

VCSEL 200 comprises a laser body 202 of the same configuration as the one depicted in FIG. 5a for producing a high energy output beam 203 via an optical element 204 which is bonded on top of laser body 202 via bonding 205. Bonding 205 may be done by conventional soldering, epoxy or laser welding techniques with soldering being the preferred bonding method. An alternative bonding technique is electrostatic bonding. Alternatively, optical element 204 may be bonded on top of annular electrode 209.

Optical element 204 is again preferably solid, radially symmetrical and designed to provide a dual function by having an inner concave surface 206 serving as the output reflector mirror for VCSEL 200 and an outer convex surface 208 serving as a lens to focus transmitted beam 203 into the spot size of aperture 302 of optical fiber 300. Optical element 204 is preferably concentric with longitudinal axis B of VCSEL 200 and made of glass. Optical elements of this type are available commercially and are usually manufactured in two-dimensional arrays. Other materials such as semiconductors, plastics, molded glass, binary optics and the like may be used to manufacture optical element 204 as long as such materials do not deviate from the intended purpose of the present invention. Typical material would be any optical material that is transparent to laser light, n-type semiconductor material may be gallium arsenide, gallium phosphite or indium phosphite.

It should be appreciated by a person of skill in the art that a semiconductor optical element 204 may be grown alternatively directly on top of laser body 202 by conventional vapor phase regrowth techniques to provide an integrated laser focusing device. Such integrated devices may be produced in arrays using conventional methods to reduce overall costs.

With regards to alignment of optical element 204 during assembly of the unit, optical element 204 may be lithographically aligned to about a micron for optimal power output. In the bonded case, the laser axis may be first centered with an infrared microscope which examines the reflective light properties of concave surface 206 relative to the gain region. Alignment may also be done while the laser is running by maximizing the output power of the laser and then soldering or epoxy or laser welding (or flash photolight bonding) the optical element at the optimal site.

A conventional dielectric anti-reflection coating 210, 304 is preferably applied on convex surface 208 of optical element 204 and on aperture 302 of optical fiber 300.

The above-described embodiments offer the advantage of greatly reducing the number of optical elements required to couple the laser diode of the present invention to an optical fiber by incorporating the function of a resonator mirror and output lens into a single optical element. Conventional edge-emitting diode lasers produce asymmetric beams which do not have a circular cross-section and which diverge significantly so that complicated external lenses are needed to collect and focus the laser output beam into the aperture of an optical fiber. Typically, the optical fiber is mounted very close to the facet of the edge-emitting laser with the fiber capturing at the most about 65% of the light output from the laser. The optical fiber used in conjunction with the present device is capable of capturing about 90% of the light output from the laser. Such an improvement would undoubtedly find great applicability in optical fiber communications and a variety of other applications.

Figure 5C:
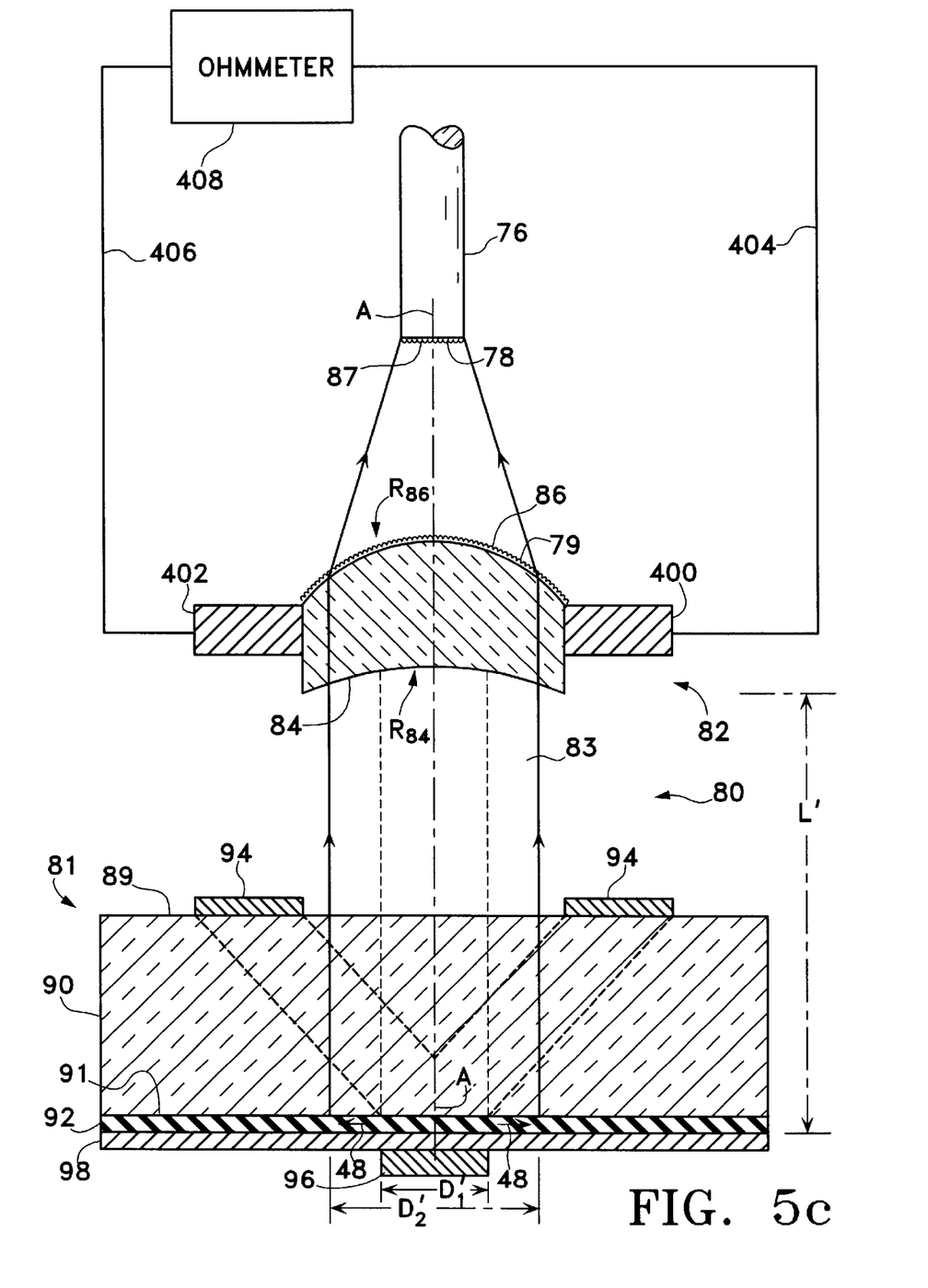
FIG. 5c is a side view of another alternative VECSEL configuration for coupling with an optical fiber and measuring the light output from the VECSEL in accordance with the present invention.

FIG. 5c illustrates yet another alternative embodiment of the present invention which includes the placement of two additional electrodes 400 and 402 preferably on each side of optical element 82 (of FIG. 5a) which, in this embodiment, is preferably made of a semiconductor material transparent to laser light. Electrodes 400 and 402 are placed on each side of semiconductor optical element 82 so as not to interfere with laser beam output. The preferred semiconductor material is gallium arsenide since gallium arsenide absorbs radiation at all wavelengths, however other semiconductor materials may be used provided that such materials are suitable for the intended purpose of the present invention. Electrode 400 is connected via a lead 404 (which is conventionally bonded to electrode 400) to an ohmmeter 408 and electrode 402 is connected, respectively, via a lead 406 (which is conventionally bonded to electrode 402) to ohmmeter 408. Both electrodes are powered by a conventional external power source (not shown).

When electrodes 400, 402 are "on" and VECSEL 80 is producing a laser beam, a certain amount of radiation is absorbed by semiconductor optical element 82 which induces generation of carriers. The generation of carriers in turn reduces the resistance of semiconductor optical element 82 with the resultant change in series resistance being measured by ohmmeter 408 (FIG. 5c). Since the resistance drop in semiconductor material 82 is proportional to the amount of radiation generated by VECSEL 80, the combination of ohmmeter 408 and electrodes 400, 402 serves as a light output detector for VECSEL 80. This type of set up eliminates the need for including an additional external light detector device as commonly practiced in the art.

Figure 5D:
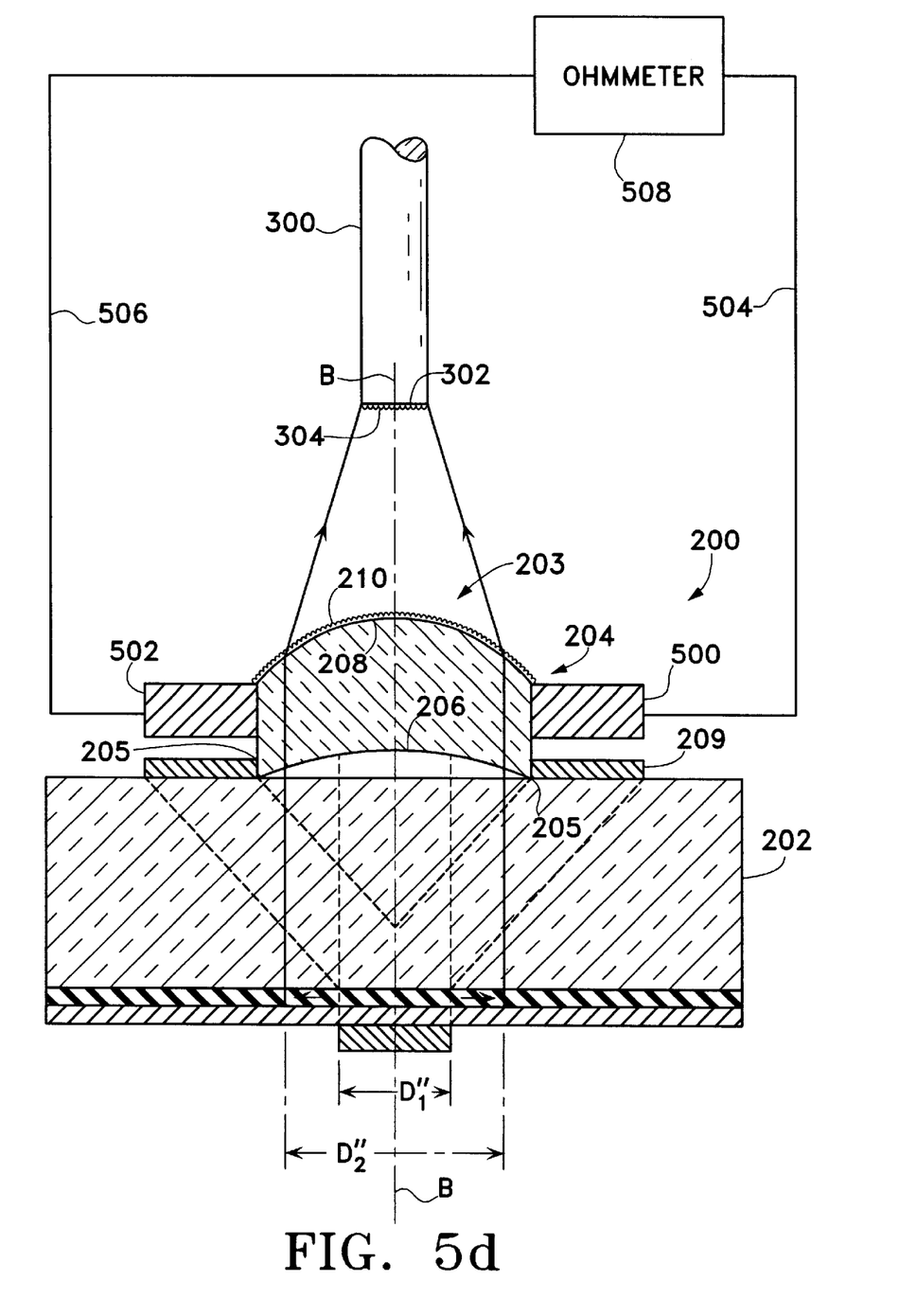
FIG. 5d is a side view of another alternative VCSEL configuration for coupling with an optical fiber and measuring the light output from the VCSEL in accordance with the present invention.

FIG. 5d illustrates a further alternative embodiment of the present invention which includes the placement of two additional electrodes 500 and 502 preferably on each side of optical element 204 (of FIG. 5b) which, in this embodiment, is preferably made of a semiconductor material transparent to laser light. Electrodes 500 and 502 are placed on each side of semiconductor optical element 204 so as not to interfere with laser beam output. The preferred semiconductor material is again gallium arsenide although other semiconductor materials may be used provided that such materials are suitable for the intended purpose of the present invention. Electrode 500 is connected via a lead 504 (which is conventionally bonded to electrode 500) to an ohmmeter 508 and electrode 502 is connected, respectively, via a lead 506 (which is conventionally bonded to electrode 502) to ohmmeter 508. Both electrodes are again powered by a conventional external power source (not shown).

When electrodes 500, 502 are "on" and VCSEL 200 is producing a laser beam, a certain amount of radiation is absorbed by semiconductor optical element 204 which induces generation of carriers. The generation of carriers in turn reduces the resistance of semiconductor optical element 204 with the resultant change in series resistance being measured by ohmmeter 508 (FIG. 5d). Since the resistance drop in semiconductor material 204 is proportional to the amount of radiation generated by VCSEL 200, the combination of ohmmeter 508 and electrodes 500, 502 serves as a light output detector for VCSEL 200. This type of set up again eliminates the need for including an additional external light detector device as commonly practiced in the art.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A laser for coupling light to the aperture of an optical fiber, said laser comprising:

a first optical element having a concave reflective surface having a first radius of curvature and a convex transmissive surface having a second radius of curvature;

a second reflector optically coupled to said first optical element, said concave reflective surface and said second reflector defining a vertical cavity resonator having an associated cavity length;

a semiconductor laser body for generating a laser beam from said vertical cavity resonator, said laser body including a substrate region within said vertical cavity resonator and an active region disposed between said substrate region and said second reflective surface; and a first electrode disposed on a surface of said substrate remote from said active region and a second electrode disposed on said second reflector, said first and second electrodes cooperating to provide a flow of current through the substrate region and the active region for electrically pumping said laser;

wherein:

said convex transmissive surface of said first optical element is disposed between said optical fiber and said vertical cavity resonator;

said cavity length is substantially proximate in value to said first radius of curvature for optimizing light output from said laser; and said first and second radius of curvature cooperate to focus said laser beam from the vertical cavity resonator into the aperture of the optical fiber.

2. The laser of claim 1, wherein said first optical element is formed of a semiconductor material and further includes a pair of electrodes connected across said semiconductor material for measuring the output power of said laser beam.

3. The laser of claim 1, wherein said first optical element is optically coupled to said laser body but is physically displaced from said laser body.

4. The laser of claim 1, wherein said first optical element is a discrete structure bonded to said laser body.

5. The laser of claim 1, wherein said second reflector is formed directly on said active region, and is said second electrode is formed directly on said second reflector.

6. The laser of claim 1, wherein said first radius of curvature is different from said second radius of curvature.

* * * * *